US012628443B2

(12) United States Patent
Zhao et al.

(10) Patent No.: US 12,628,443 B2
(45) Date of Patent: May 12, 2026

(54) METHOD OF MANUFACTURING TERAHERTZ DETECTION DEVICE, AND DETECTION APPARATUS

(71) Applicants: NUCTECH COMPANY LIMITED, Beijing (CN); SHENMUTEK COMPANY LIMITED, Beijing (CN); TSINGHUA UNIVERSITY, Beijing (CN)

(72) Inventors: Ziran Zhao, Beijing (CN); Shoulu Jiang, Beijing (CN); Xuming Ma, Beijing (CN)

(73) Assignees: Nuctech Company Limited, Beijing (CN); Shenmutek Company Limited, Beijing (CN); Tsinghua University, Beijing (CN)

( * ) Notice: Subject to any disclaimer, the term of this patent is extended or adjusted under 35 U.S.C. 154(b) by 729 days.

(21) Appl. No.: 18/054,270

(22) Filed: Nov. 10, 2022

(65) Prior Publication Data

US 2023/0154942 A1      May 18, 2023

(30) Foreign Application Priority Data

Nov. 12, 2021      (CN) .......................... 202111335830.6

(51) Int. Cl.
 *H10F 39/10*      (2025.01)
 *H01L 23/544*      (2006.01)
 (Continued)

(52) U.S. Cl.
 CPC ......... *H10F 39/107* (2025.01); *H01L 23/544* (2013.01); *H10F 71/00* (2025.01); *H10F 77/413* (2025.01); *H01L 2223/54426* (2013.01)

(58) Field of Classification Search
 CPC ...... H10F 39/107; H10F 71/00; H10F 77/413; H10F 30/10; H10F 39/024; H10F 77/00;
 (Continued)

(56) References Cited

U.S. PATENT DOCUMENTS 5,985,363 A  *  11/1999  Shiau ................ H01L 21/02118
                                                            427/407.1
2013/0098835 A1*   4/2013  Hinestroza ................ G03F 7/20
                                                            430/320
 (Continued)

FOREIGN PATENT DOCUMENTS

CN          102027343 A  *  4/2011  ........... G02B 5/1861
CN          102201487 A  *  9/2011
 (Continued)

OTHER PUBLICATIONS

English translation of description for "CN 102027343 A" Shibayama et al., "Spectral Module", Apr. 20, 2011 (Year: 2011).*
 (Continued)

*Primary Examiner* — Mounir S Amer
*Assistant Examiner* — Nicholas B Michaud
(74) *Attorney, Agent, or Firm* — Knobbe, Martens, Olson & Bear, LLP

(57) ABSTRACT

Provided are a method of manufacturing a terahertz detection device including detectors and lenses arranged in an array and a terahertz detection apparatus. An example method includes forming detectors in a first area of a first surface of a base substrate through a double-sided photo-etching process to form a detector array, and providing at least one first alignment mark in a second area of the first surface of the base substrate. A plurality of lens mounting parts are formed in a third area of a second surface of the base substrate through the double-sided photoetching process, and at least one second alignment mark is provided in
 (Continued)

200

A plurality of detectors are formed in the first area of the first surface of the base substrate through a double-sided photoetching process to form a detector array, and at least one first alignment mark is provided in the second area of the first surface of the base substrate  /—S201

A plurality of lens mounting parts are formed in the third area of the second surface of the base substrate through the double-sided photoetching process, and at least one second alignment mark is provided in the fourth area of the second surface of the base substrate, wherein the first alignment mark and the second alignment mark are aligned by the double-sided photoetching machine, so that the offset of the center of the detector with respect to the center of the lens mounting part is within a preset range  /—S202

The lenses are mounted to the lens mounting parts to form the detection device  /—S203 a fourth area of the second surface of the base substrate. The lenses are mounted to the lens mounting parts to form the detection device. The first alignment mark is aligned with the second alignment mark by using a double-sided photo-etching machine.

12 Claims, 5 Drawing Sheets

(51) Int. Cl.
  *H10F 71/00*    (2025.01)
  *H10F 77/40*    (2025.01)
(58) Field of Classification Search
  CPC ................. H10F 77/407; H01L 23/544; H01L
       2223/54426; G01J 3/42; G01J 5/024;
      G01J 5/0806; G01J 5/0837; G01J 1/00;
                 Y02P 70/50
  USPC ................................................. 257/414, 428
  See application file for complete search history.

(56)        References Cited

U.S. PATENT DOCUMENTS

| | | | | | |
|---|---|---|---|---|---|
| 2014/0187048 | A1* | 7/2014 | Murakami | ........ | H01L 21/76822 |
| | | | | | 438/703 |
| 2014/0367668 | A1* | 12/2014 | Fujii | .................... | H10F 39/024 |
| | | | | | 257/40 |
| 2019/0221437 | A1* | 7/2019 | Yang | ................. | H01J 37/32091 |
| 2022/0066320 | A1* | 3/2022 | Kaitz | ........................ | G03F 7/11 |

FOREIGN PATENT DOCUMENTS

| | | | | | | |
|---|---|---|---|---|---|---|
| CN | 104418295 | A | * | 3/2015 | | |
| CN | 105890769 | A | * | 8/2016 | .......... | G02B 3/0037 |
| CN | 210957258 | U | | 7/2020 | | |
| CN | 113777072 | A | | 12/2021 | | |
| CN | 113782644 | A | | 12/2021 | | |
| KR | 101500181 | B1 | * | 3/2015 | .............. | B01J 23/42 |

OTHER PUBLICATIONS

English translation of description for "CN 102201487 A" Hu et al., "Method For Optimizing Light Gathering Power of Micro Lens Array of Lighted Type Infrared Detector", Sep. 28, 2011 (Year: 2011).*
English translation of description for "CN 104418295 A" Jing et al., "Double Surface For MEMS Micro-machining Method and MEMS Device", Aug. 28, 2013 (Year: 2013).*
English translation of description for "CN 105890769 A" Lou et al., "Terahertz Focal Plane Array and Design Method Thereof", Aug. 24, 2016 (Year: 2016).*
English translation of "KR 101500181 B1" Kim et al, âcounter Electrode for Dye-Sencitized Solar Cell and Method for Manufacturing the Same, Mar. 6, 2015 (Year: 2015).*
International Search Report and Written Opinion (non-English) issued Jan. 18, 2023 for International Application No. PCT/CN2022/127693, 9 pages.

* cited by examiner

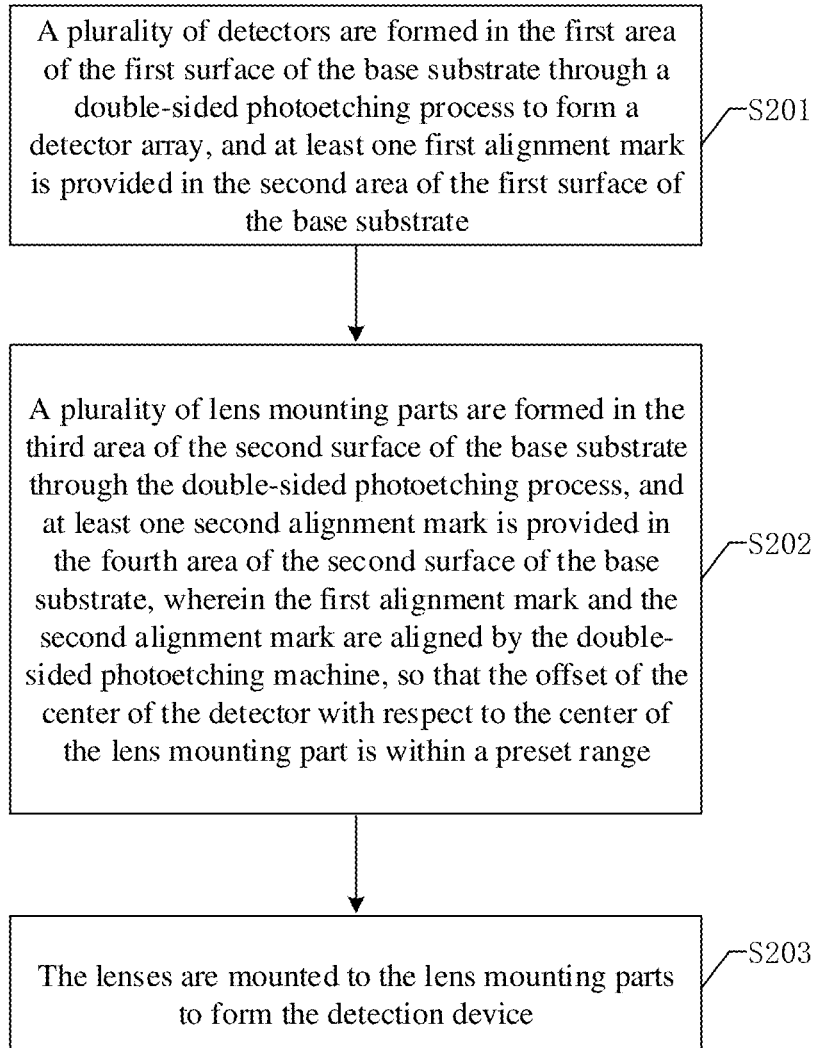

200

A plurality of detectors are formed in the first area of the first surface of the base substrate through a double-sided photoetching process to form a detector array, and at least one first alignment mark is provided in the second area of the first surface of the base substrate ⟋—S201

A plurality of lens mounting parts are formed in the third area of the second surface of the base substrate through the double-sided photoetching process, and at least one second alignment mark is provided in the fourth area of the second surface of the base substrate, wherein the first alignment mark and the second alignment mark are aligned by the double-sided photoetching machine, so that the offset of the center of the detector with respect to the center of the lens mounting part is within a preset range ⟋—S202

The lenses are mounted to the lens mounting parts to form the detection device ⟋—S203

METHOD OF MANUFACTURING TERAHERTZ DETECTION DEVICE, AND DETECTION APPARATUS

CROSS-REFERENCE TO RELATED APPLICATIONS

This application claims priority to Chinese Patent Application No. 202111335830.6, filed on Nov. 12, 2021, the disclosure of which is incorporated herein by reference in its entirety.

TECHNICAL FIELD

The present disclosure relates to a field of terahertz detection technology, and in particular to a method of manufacturing a terahertz detection device and a terahertz detection apparatus.

BACKGROUND

A terahertz wave is an electromagnetic wave with an oscillation frequency of 0.1 THz to 10 THz, having characteristics of good penetrability, low single photon energy, rich spectral information and the like, and having important application values in fields of security inspection imaging, spectral detection, information communication and the like.

In the related art, a detector of a detection device needs to be provided with a lens so as to converge signals. A substrate of the detector is generally clamped by a mechanical member, and a region to which the lens is mounted is processed by the mechanical member. Since a mechanical processing accuracy is greatly influenced by an ambient temperature, when a mechanical clamping part is used for processing the region for mounting the lens, the mechanical part is influenced by effects of thermal expansion and cold contraction, so that an error is further increased, and thus an alignment accuracy of the lens of a manufactured terahertz detection apparatus is poor.

SUMMARY

In view of the above-mentioned problems, the present disclosure provides a method of manufacturing a terahertz detection device and a terahertz detection apparatus, which may effectively solve the above-mentioned problems and defects existing in the related art.

According to a first aspect of the present disclosure, a method of manufacturing a terahertz detection device is provided, the terahertz detection device including detectors and lenses arranged in an array, wherein the method includes: forming a plurality of detectors in a first area of a first surface of a base substrate through a double-sided photoetching process so as to form a detector array, and providing at least one first alignment mark in a second area of the first surface of the base substrate; forming a plurality of lens mounting parts in a third area of a second surface of the base substrate through the double-sided photoetching process, and providing at least one second alignment mark in a fourth area of the second surface of the base substrate; and mounting the lenses to the lens mounting parts to form the terahertz detection device, wherein after the first alignment mark is provided and before the second alignment mark is provided, a providing position of the second alignment mark is determined by using a double-sided photoetching machine to complete an alignment of the first alignment mark with the second alignment mark, so that an offset of a center of the detector with respect to a center of the lens mounting part is within a preset range.

In some embodiments of the present disclosure, a projection of the detector on the base substrate is located within a projection of the lens mounting part on the base substrate.

In some embodiments of the present disclosure, the detector includes a sensitive unit and a detection antenna, and the center of the detector coincides with a center of the sensitive unit.

In some embodiments of the present disclosure, the forming a plurality of lens mounting parts in a third area of a second surface of the base substrate through the double-sided photoetching process includes: coating a photoresist on the second surface of the base substrate, wherein a coating thickness of the photoresist is in a range of 3 to 5 μm; drying, exposing and developing the photoresist; and etching the base substrate to form the lens mounting parts.

In some embodiments of the present disclosure, the coating a photoresist on the second surface of the base substrate includes: precoating the photoresist on the base substrate, wherein a rotating speed of the precoating is 500 to 700 rpm, and a duration of the precoating is 5 to 7 seconds; and after the precoating is completed, performing a second coating, wherein a rotating speed of the second coating is 5000 to 6000 rpm, and a duration of the second coating is 15 to 25 seconds.

In some embodiments of the present disclosure, the drying includes a first drying and a second drying; a duration of the first drying is 1.8 to 2.2 minutes, and a temperature of the first drying is within a range of 95 to 105° C.; and a duration of the second drying is 0.8 to 1.2 minutes, and a temperature of the second drying is within a range of 85 to 95° C.

In some embodiments of the present disclosure, a duration of the exposing is 6 to 8 seconds, and a duration of the developing is 30 to 40 seconds.

In some embodiments of the present disclosure, a projection of the lens on the base substrate is circular; an inner diameter of the lens mounting part is larger than an outer diameter of the lens; and a difference between the inner diameter of the lens mounting part and the outer diameter of the lens is less than or equal to 5 μm.

In some embodiments of the present disclosure, an inner diameter of the lens mounting part on a side of the lens mounting part close to the base substrate is smaller than an inner diameter of the lens mounting part on a side of the lens mounting part away from the base substrate.

In some embodiments of the present disclosure, an etching depth of the lens mounting part is greater than or equal to 30 μm.

In some embodiments of the present disclosure, the base substrate is etched by an inductively coupled plasma etching machine.

In some embodiments of the present disclosure, types of the lenses include at least one of a sub-hemispherical lens, a hemispherical lens, and a hyper-hemispherical lens.

In some embodiments of the present disclosure, after mounting the lenses to the lens mounting parts to form the terahertz detection device, and the method further includes: coating an adhesive on a joint of the lens and the base substrate to fix the lens on the base substrate; or mounting a fixing piece on the base substrate to fix the lens on the base substrate.

In some embodiments of the present disclosure, the preset range is a range of 0 to 10 μm.

A second aspect of the present disclosure provides a terahertz detection apparatus, including the terahertz detection device manufactured by the method described above.

According to the method of manufacturing a terahertz detection device in the various embodiments of the present disclosure, the lens mounting part is processed by using the double-sided photoetching process, so that a processing accuracy of the lens mounting part is higher. Meanwhile, the first alignment mark and the second alignment mark are aligned by using the double-sided photoetching machine, so that the alignment accuracy between the lens mounting part on the second surface of the base substrate and the detector on the first surface of the base substrate may be higher, which may effectively improve the mounting accuracy of the lens and the detector, enhance the signal receiving capability of the detector, and improve the response rate of the detector.

BRIEF DESCRIPTION OF THE DRAWINGS

The above contents and other objectives, features and advantages of the present disclosure will become more apparent through the following descriptions of embodiments of the present disclosure with reference to the accompanying drawings.

FIG. 2 schematically shows a flowchart of a method of manufacturing a terahertz detection device according to embodiments of the present disclosure.

DETAILED DESCRIPTION OF EMBODIMENTS

Figure 1A:
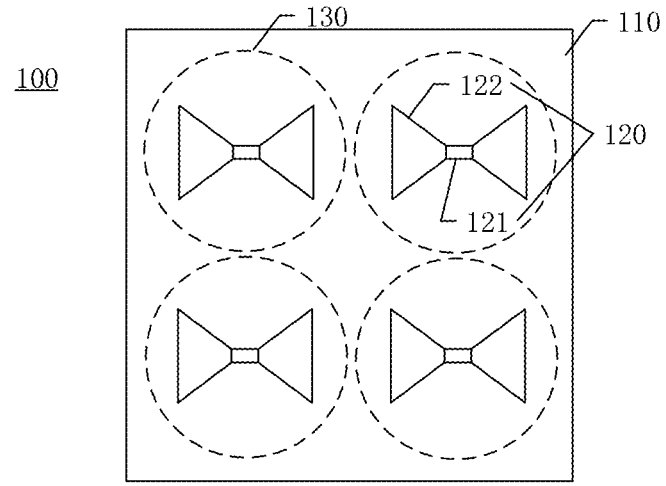
FIG. 1A schematically shows a top view of a terahertz detection device according to embodiments of the present disclosure.

Embodiments of the present disclosure will be described below with reference to the accompanying drawings. It should be understood that, however, these descriptions are merely exemplary and are not intended to limit the scope of the present disclosure. In the following detailed descriptions, for ease of explanation, various specific details are set forth in order to provide a comprehensive understanding of the embodiments of the present disclosure. However, it is obvious that one or more embodiments may be implemented without these specific details. In addition, in the following descriptions, descriptions of well-known structures and technologies are omitted to avoid unnecessarily obscuring the concept of the present disclosure.

Terms used herein are for purpose of describing specific embodiments only and are not intended to limit the present disclosure. Terms "comprising", "including" and the like used herein indicate a presence of a feature, a step, an operation and/or a component, but do not preclude a presence or addition of one or more other features, steps, operations or components.

All terms (including technical and scientific terms) used herein have the same meaning as commonly understood by those of ordinary skill in the art, unless otherwise defined. It should be noted that the terms used herein should be construed to have meanings consistent with the context of the present specification and should not be construed in an idealized or overly rigid manner.

Embodiments of the present disclosure provides a method of manufacturing a terahertz detection device, wherein the detection device includes detectors and lenses arranged in an array, and the method includes: forming a plurality of detectors in a first area of a first surface of a base substrate through a double-sided forming process to form a detector array, and providing at least one first alignment mark in a second area of the first surface of the base substrate; forming a plurality of lens mounting parts in a third area of a second surface of the base substrate through the double-sided photoetching process, and providing at least one second alignment mark in a fourth area of the second surface of the base substrate; and mounting a lens to the lens mounting part to form the detection device. The first alignment mark and the second alignment mark are aligned by using a double-sided photoetching machine, so that an offset of a center of the detector with respect to a center of the lens mounting part is within a preset range, that is, after the first alignment mark is set and before the second alignment mark is set, a providing position of the second alignment mark is determined by using the double-sided photoetching machine to complete an alignment of the first alignment mark and the second alignment mark.

According to embodiments of the present disclosure, the detector and the lens mounting part are processed by using the double-sided photoetching process, so that a processing accuracy may be effectively improved and a processing error may be reduced. In addition, by using the double-sided photoetching machine to align the first alignment mark with the second alignment mark, the offset of the center of the detector with respect to the center of the lens mounting part may be further reduced, an alignment accuracy between the detector and the lens mounting part may be improved, a mounting accuracy of the lens and the detector may be effectively improved, a signal receiving capability of the detector may be enhanced, and a response rate of the detector may be improved.

Figure 1B:
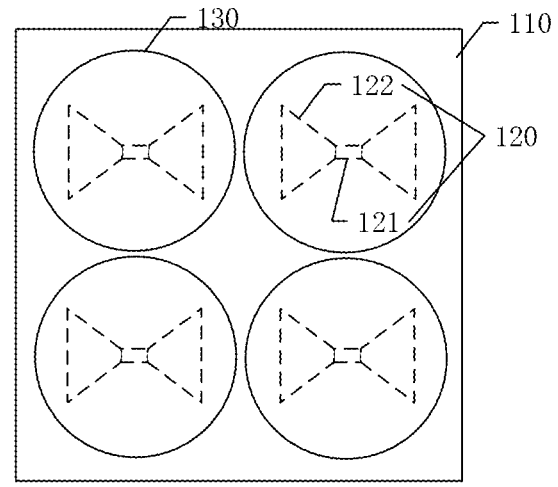
FIG. 1B schematically shows a bottom view of a terahertz detection device according to embodiments of the present disclosure.
Figure 1C:
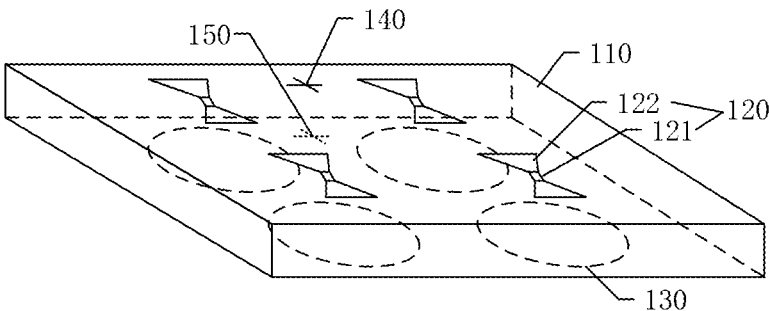
FIG. 1C schematically shows a perspective view of a terahertz detection device according to embodiments of the present disclosure.

FIG. 1A schematically shows a top view of a terahertz detection device according to embodiments of the present disclosure. FIG. 1B schematically shows a bottom view of a terahertz detection device according to embodiments of the present disclosure. FIG. 1C schematically shows a perspective view of a terahertz detection device according to embodiments of the present disclosure.

FIG. 1A to FIG. 1C schematically show schematic diagrams of a terahertz detection device 100 according to embodiments of the present disclosure. It should be noted that FIG. 1 is only an example of a structure of the terahertz detection device 100 to help those skilled in the art understand the technical content of the present disclosure, but it does not mean that embodiments of the present disclosure may not have other structures. It should be noted that the method of manufacturing a terahertz detection device provided by embodiments of the present disclosure may be used in the field of terahertz detection technology, and may also be used in any field other than the field of terahertz detection technology. The application field of the method of manufacturing a terahertz detection device provided by embodiments of the present disclosure is not limited.

As shown in FIG. 1A to FIG. 1C, the terahertz detection device 100 may include a base substrate 110, and the base substrate 110 has a first surface and a second surface arranged relative to each other. A plurality of detectors 120 are arranged on the first surface of the base substrate 110, and the plurality of detectors 120 form a detector array. A plurality of lenses 130 are arranged on the second surface of the base substrate 110. The lens 130 is mounted by a lens mounting part (see 131 in FIG. 3B below) on the base substrate 110. The lens 130 is fixed and mounted on the base substrate 110 by the lens mounting part, and the lens 130 is located at a position opposite to the detector 120, so that the lens 130 may enhance a signal receiving ability of the detector 120 and improve a response rate of the detector 120.

The detector 120 is arranged in a first area of the first surface, and the plurality of detectors 120 form the detector array. The detector 120 includes a sensitive unit 121 arranged at a central position and a detection antenna 122. The sensitive unit 121 is used to convert a received signal, and the detection antenna 122 is used to receive a signal. A shape of the detection antenna 122 may be set into a spiral antenna, a double slit antenna, and the like so as to meet requirements of receiving different signals.

As shown in FIG. 1C, during a process of manufacturing the detection device 100, at least one first alignment mark 140 is provided in a second area of the first surface of the base substrate 110. The second area is different from the first area. Meanwhile, at least one second alignment mark 150 is provided in a fourth area of the second surface of the base substrate 110. The first alignment mark 140 and the second alignment mark 150 are provided opposite to each other and located on two surfaces. A position between the second alignment mark 150 and the lens mounting parts in the third area is positioned according to a position between the first alignment mark 140 and the detectors 120. Thus, a center of the detector 120 on the first surface is aligned with a center of the lens mounting part on the second surface, so that an offset of the lens 130 with respect to the detector 120 when being mounted is reduced, a mounting accuracy of the lens and the detector is effectively improved, a signal reception capability of the detector is enhanced, and a response rate of the detector is improved.

In embodiments of the present disclosure, the first alignment mark and the second alignment mark are provided on two surfaces of one same base substrate. Therefore, after the first alignment mark is provided on the first surface of the base substrate, a providing position of the second alignment mark on the second surface of the base substrate is required to be determined, the providing position of the second alignment mark on the second surface of the base substrate is recorded, and then the second alignment mark at the position is provided so as to achieve the alignment of the first alignment mark with the second alignment mark.

FIG. 2 schematically shows a flowchart of a method of manufacturing a terahertz detection device according to embodiments of the present disclosure.

As shown in FIG. 2, a process 200 of the method of manufacturing the terahertz detection device in embodiments of the present disclosure includes operation S201 to operation S203.

In operation S201, a plurality of detectors are formed in the first area of the first surface of the base substrate through a double-sided photoetching process to form a detector array, and at least one first alignment mark is provided in the second area of the first surface of the base substrate.

For example, the base substrate may be a silicon substrate, and in alternative embodiments, the substrate material may be other semiconductor materials.

As shown in FIG. 1A to FIG. 1C, first, a plurality of detectors 120 are formed in the first area of the first surface of the base substrate 110 by the double-sided photoetching process, and the plurality of detectors 120 form a detector array for receiving a plurality of signals. At least one first alignment mark 140 is provided in the second area different from the first area in the base substrate 110. There are distance coordinates and correspondences between the first alignment mark 140 and the detectors 120. Specifically, a distance coordinate parameter between a center position of each detector 120 and the first alignment mark 140 is recorded so as to facilitate a positioning and processing of a lens mounting part in a subsequent processing process.

In the embodiment, for example, one first alignment mark 140 may be provided. In alternative embodiments, for example, two or more first alignment marks 140 may be provided so as to improve an alignment accuracy.

In operation S202, a plurality of lens mounting parts are formed in the third area of the second surface of the base substrate 110 through the double-sided photoetching process, and at least one second alignment mark 150 is provided in the fourth area of the second surface of the base substrate 110. The first alignment mark 140 and the second alignment mark 150 are aligned by using the double-sided photoetching machine so that the offset of the center of the detector 120 with respect to the center of the lens mounting part is within a preset range.

In embodiments of the present disclosure, before forming the lens mounting part by using the double-sided photoetching process, the second alignment mark 150 is required to be provided on the second surface of the base substrate 110, and the first alignment mark 140 and the second alignment mark 150 are aligned by using the double-sided photoetching machine. For example, the position of the first alignment mark 140 on the first surface is determined, and the distance coordinate parameter between the first alignment mark 140 and each detector 120 is determined according to the position of the first alignment mark 140 on the first surface. Next, a position of the second alignment mark 150 on the second surface is determined, that is, a providing position of the second alignment mark is determined by using the double-sided photoetching machine so as to complete the alignment of the first alignment mark with the second alignment mark. After the position of the second alignment mark 150 on the second surface is determined, the second alignment mark 150 is provided on the second surface, then distance coordinate parameters between the second alignment mark 150 and the lens mounting parts may be determined according to the distance coordinate parameters between the first alignment mark 140 and each detector 120. For example, the position of the center of each lens mounting part and the center of the corresponding detector is determined. Then, the second surface of the base substrate 110 is formed by using the double-sided photoetching process to form the lens mounting part.

In embodiments of the present disclosure, the first alignment mark 140 is aligned with the second alignment mark 150. For example, the second alignment mark 150 may be determined as a position on the second surface opposite to the first alignment mark 140 on the first surface, that is, a projection of the first alignment mark 140 on the second surface overlaps the second alignment mark 150. In alternative embodiments, the projection of the first alignment mark on the second surface does not overlap the second alignment mark, and a distance coordinate relationship between the first alignment mark and the second alignment mark on different surfaces may be obtained. Based on the distance coordinate relationship, a distance relationship between the second alignment mark and each lens mounting part may be calculated, so that an offset of a projection center of the center of the lens mounting part on the base substrate with respect to a projection center of the center of the detector on the base substrate is within a preset range.

In embodiments of the present disclosure, the preset range is, for example, within a range of 0 to 10 μm, such as 2 μm, 5 μm, or 10 μm. That is, as long as the offset of the center of the lens mounting part with respect to the center of the detector is within the preset range, the signal receiving capability of the detector may be guaranteed and the response rate of the detector may be improved.

According to embodiments of the present disclosure, the alignment accuracy of the double-sided photoetching machine may reach a micron level, or even a nanometer level, which may effectively improve a position accuracy between the detector and the lens mounting part. Thus, after the lens is mounted, the lens and the detector may be better aligned, which enhances the signal receiving capability of the detector, and improves the response rate of the detector.

In operation S203, the lenses are mounted to the lens mounting parts to form the detection device.

According to the position of the lens mounting part on the second surface of the base substrate determined in operation S202, the alignment accuracy between the lens mounting part and the detector is good. The detection device formed by mounting the lenses to the lens mounting parts has a better signal receiving capability.

In embodiments of the present disclosure, the lens is mounted to the lens mounting part by manual mounting. For example, the mounting may be performed under a stereoscopic microscope, and the plurality of lenses are respectively mounted to the lens mounting parts. The lens is slightly touched left and right with a tweezer, and if a lens movement range is limited or the lens does not move, it is indicated that the lens has been successfully mounted to the lens mounting part.

In alternative embodiments, a high-accuracy mounting apparatus may be selected to mount the lens to the lens mounting part.

In embodiments of the present disclosure, the method, after mounting the lens to the lens mounting part to form the detection device, further includes: coating an adhesive on a joint of the lens and the base substrate so as to fix the lens on the base substrate; or mounting a fixing piece on the base substrate so as to fix the lens on the base substrate.

According to embodiments of the present disclosure, the lens may be effectively fixed with the lens mounting part on the base substrate by coating the adhesive or mounting the fixing piece to prevent the lens from falling off from the lens mounting part.

In embodiments of the present disclosure, a projection of the detector on the base substrate 110 is located within a projection of the lens mounting part on the base substrate.

As shown in FIG. 1A and FIG. 1B, a projection (including the sensitive unit 121 and the detection antenna 122) of the detector 120 on the base substrate 110 is located within a projection of the lens mounting part on the base substrate 110. Thus, signals may be converged to the detector 120 by the lens 130, and the signal receiving capability of the detector 120 may be improved.

In embodiments of the present disclosure, the center of the detector 120 coincides with a center of the sensitive unit 121. By making the center of the detector 120 coincide with the center of the sensitive unit 121, the signals may be better received by the sensitive unit 121 when the lens 130 receives signals. In addition, when the detector 120 and the lens mounting part are positioned, the center of the detector 120 is aligned with the center of the lens mounting part by aligning the first alignment mark with the second alignment mark, which may better control the offset within the preset range, and improve the alignment accuracy.

Figures 3A, 3B, 3C, 3D:
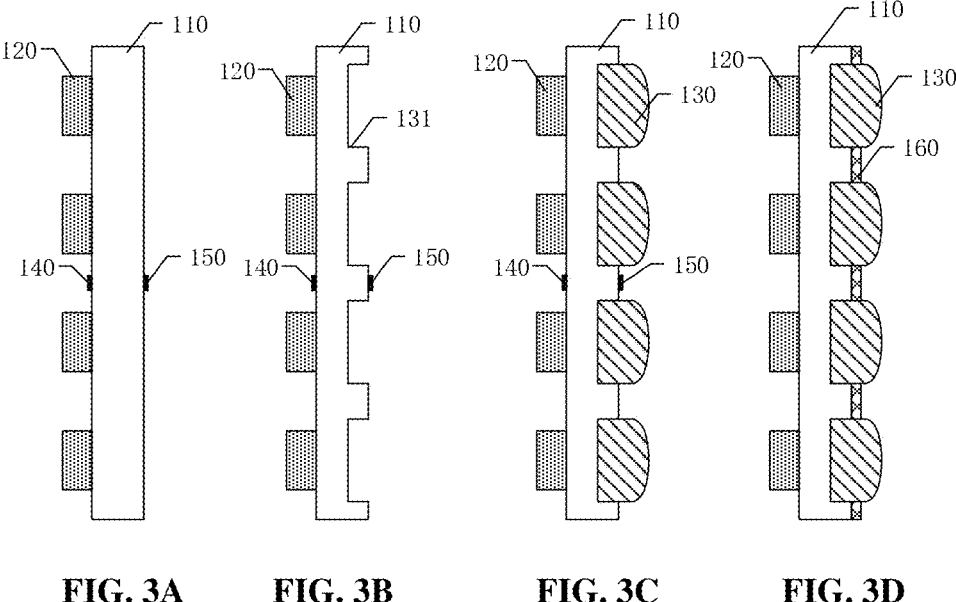
FIG. 3A schematically shows a schematic diagram of a cross-sectional structure of a terahertz detection device in a manufacturing process S201 according to embodiments of the present disclosure.
FIG. 3B schematically shows a schematic diagram of a cross-sectional structure of a terahertz detection device in a manufacturing process S202 according to embodiments of the present disclosure.
FIG. 3C schematically shows a schematic diagram of a cross-sectional structure of a terahertz detection device in a manufacturing process S203 according to embodiments of the present disclosure.
FIG. 3D schematically shows a schematic diagram of a cross-sectional structure of a terahertz detection device after the manufacturing process S203 according to embodiments of the present disclosure.

FIG. 3A schematically shows a schematic diagram of a cross-sectional structure of a terahertz detection device in a manufacturing process S201 according to embodiments of the present disclosure. FIG. 3B schematically shows a schematic diagram of a cross-sectional structure of a terahertz detection device in a manufacturing process S202 according to embodiments of the present disclosure. FIG. 3C schematically shows a schematic diagram of a cross-sectional structure of a terahertz detection device in a manufacturing process S203 according to embodiments of the present disclosure. FIG. 3D schematically shows a schematic diagram of a cross-sectional structure of a terahertz detection device after the manufacturing process S203 according to embodiments of the present disclosure.

As shown in FIG. 3A, first, a plurality of detectors 120 are formed in the first area of the first surface of the base substrate 110 by the double-sided photoetching process to form a detector array. Next, a first alignment mark 140 is provided in the second area of the first surface of the base substrate 110. There is a distance coordinate parameter between the first alignment mark 140 and each detector 120. Next, a second alignment mark 150 is provided on the second surface of the base substrate 110 according to a position of the first alignment mark 140. The first alignment mark 140 and the second alignment mark 150 are aligned by using the double-sided photoetching machine. According to the position of the second alignment mark 150 on the second surface and the distance coordinate parameters between each detector 120 and the first alignment mark 140, distance coordinate parameters between the lens mounting parts and the second alignment mark 150 may be determined, thereby a position of the lens mounting part to be formed is determined, so that an offset of a center of the detector with respect to a center of the lens mounting part is within a preset range. That is, the lens mounting part is arranged at a position opposite to each detector 120, the first alignment mark 140 is aligned with the second alignment mark 150 by using the double-sided photoetching machine, a mounting accuracy of the lens may be improved, a signal receiving capability of the detector may be enhanced, and a response rate of the detector may be improved.

As shown in FIG. 3B, after the first alignment mark 140 and the second alignment mark 150 are aligned, the distance coordinate parameter between the second alignment mark 150 and the lens mounting part 131 and a forming position of the lens mounting part 131 are determined. Next, a plurality of lens mounting parts 131 are formed in the third area of the second surface of the base substrate by using the double-sided photoetching process.

As shown in FIG. 3C, after the plurality of lens mounting parts 131 are formed, the lens 130 may be mounted to the lens mounting part 131 by, for example, a manual mounting method or a machine mounting method.

As shown in FIG. 3D, after the lens 130 is mounted to the lens mounting part 131, a fixing piece 160 is mounted on the base substrate to fix the lens 130 on the base substrate 110, which may effectively prevent the lens 130 from falling off from the lens mounting part 131 of the base substrate 110. In alternative embodiments, the lens 130 may be fixed on the base substrate 110 by coating an adhesive on an edge where the base substrate 110 and the lens 130 contact with each other.

Figure 4:
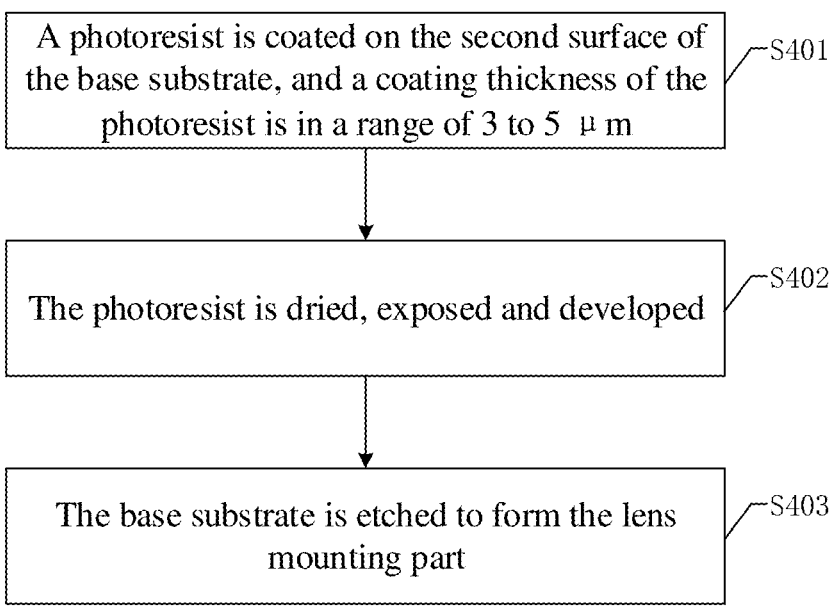
FIG. 4 schematically shows a flowchart of forming a lens mounting part according to a method of manufacturing a terahertz detection device according to embodiments of the present disclosure.

FIG. 4 schematically shows a flowchart of forming a lens mounting part according to a method of manufacturing a terahertz detection device according to embodiments of the present disclosure.

As shown in FIG. 4, a process 400 of forming a lens mounting part according to the method of manufacturing a terahertz detection device according to embodiments of the present disclosure includes operation S401 to operation S403.

In operation S401, a photoresist is coated on the second surface of the base substrate, and a coating thickness of the photoresist is in a range of 3 to 5 μm. In the embodiments of the present disclosure, AZ6130, for example, may be selected as the photoresist. The photoresist has better anti etching performance and higher thickness, and after the photoetching is completed and the development is performed, a silicon substrate area of the base substrate is exposed so as to meet requirements of a deep silicon etching process in embodiments of the present disclosure.

The photoresist is precoated on the second surface of the base substrate 110, and a speed of the precoating may be set to 500 to 700 rpm, such as 500 rpm, 600 rpm, or 700 rpm. A duration of the precoating may be set to 5 to 7 seconds, such as 5 seconds, 6 seconds or 7 seconds.

A second coating is performed after the precoating is completed, and a speed of the second coating may be set to 5000 rpm to 6000 rpm, such 5000 rpm or 6000 rpm. A duration of the second coating is set to 15 seconds to 25 seconds, such as 15 seconds, 20 seconds, or 25 seconds.

In operation S402, after the coating of the photoresist is completed, the photoresist is dried, exposed and developed.

In embodiments of the present disclosure, the drying includes a first drying and a second drying.

A duration of the first drying may be set to 1.8 to 2.2 minutes, such as 2 minutes. A temperature of the first drying is within a range of 95 to 105° C., such as 100° C.

A duration of the second drying may be set to 0.8 to 1.2 minutes, such as 1 minute. A temperature of the second drying is within a range of 85 to 95° C., such as 90° C.

According to embodiments of the present disclosure, a process of twice drying is used, so that a uniformity of heat transfer is ensured while an effect of volatilization of a solvent of the photoresist is ensured.

An exposure is performed after the drying is completed. For example, a duration of the exposure may be set to 6 to 8 seconds, such as 7 seconds. After the exposure, a development is performed. A duration of the development may be set to 30 to 40 seconds, such as 35 seconds.

In operation S403, the base substrate is etched to form the lens mounting part. After the etching is completed, the photoresist is cleaned on the base substrate to facilitate subsequent operations.

In embodiments of the present disclosure, the base substrate is etched by an inductively coupled plasma etching machine, which may obtain a larger etching depth.

In order to avoid an offset of the lens caused by a shallow depth of the lens mounting part after the lens is mounted to the lens mounting part, it is necessary to ensure that the lens mounting part has a deep etching depth during an etching process. For example, the etching depth of the lens mounting part is kept above 30 μm so as to prevent the lens from offsetting or sliding when being mounted to the lens mounting part and thus affecting the detection accuracy of the detector.

When the etching depth of the base substrate is deep, an inductively coupled plasma (ICP) etching machine required by deep silicon etching is required for etching, so that a deeper etching depth may be achieved. Meanwhile, an edge of the lens mounting part may be steep by using said etching machine, and a surface of a photoetching area may be smooth, which is convenient for mounting the lens.

In embodiments of the present disclosure, a projection of the lens on the base substrate is circular, an inner diameter of the lens mounting part is larger than an outer diameter of the lens. For example, a periphery of the lens is cylindrical. An inner part of the lens mounting part is in a cylindrical shape matched with a shape of the lens, which is convenient for mounting the lens. The inner diameter of the lens mounting part is larger than the outer diameter of the lens, which may achieve a positioning of the lens. For example, a difference between the inner diameter of the lens mounting part and the outer diameter of the lens is less than or equal to 5 μm, and in this size, a fitting mounting of the lens and the lens mounting part may be better achieved.

In embodiments of the present disclosure, an inner diameter of the lens mounting part on a side close to the base substrate is smaller than an inner diameter of the lens mounting part on a side away from the base substrate.

Figure 5:
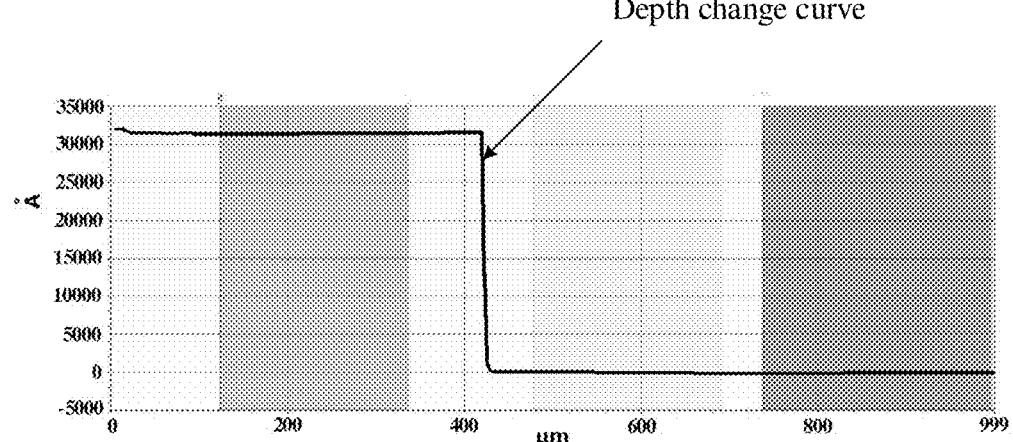
FIG. 5 schematically shows a test depth curve of a lens mounting part manufactured according to a method of manufacturing a terahertz detection device according to embodiments of the present disclosure.

FIG. 5 schematically shows a test depth curve of a lens mounting part manufactured according to a method of manufacturing a terahertz detection device according to embodiments of the present disclosure.

As shown in FIG. 5, according to a test result, a depth change curve of the edge of the lens mounting part is shown, in which the inner diameter of the lens mounting part on a side (bottom) close to the base substrate is smaller than the inner diameter of the lens mounting part on a side (top) away from the base substrate. That is, the lens mounting part is in an approximately cylindrical shape with a larger top and a smaller bottom. The shape may be used to better fix the lens without affecting the effect of the lens.

It can be learnt from FIG. 5 that a side wall of the lens mounting part etched by the deep silicon etching process is smooth, and the side wall of the lens mounting part is in a shape nearly vertical to a bottom surface, with a depth of more than 30 nm, which is convenient for mounting the lens.

In embodiments of the present disclosure, types of the lenses include at least one of a sub-hemispherical lens, a hemispherical lens and a hyper-hemispherical lens, which may be selected according to actual needs. For example, in the detector array, according to different requirements, all the lenses may be set as hemispherical lenses, or a part of the lenses may be set as hemispherical lenses, and other parts of the lenses may be set as sub-hemispherical lenses or hyper-hemispherical lenses. For example, the lens may be a silicon lens.

For example, the hyper-hemispherical lens may be used for effectively converging terahertz signals and eliminating medium surface waves. By using the sub-hemispherical lens, a large-scale detector array may be achieved by using a micromachining process, and a signal-to-noise ratio of the device may be improved by using a convergence effect of the sub-hemispherical lens.

In another embodiment of the present disclosure, there is further provided a terahertz detection apparatus including the terahertz detection device described above, and the terahertz detection device is manufactured by the method described above.

Those skilled in the art should understand that features recited in the various embodiments and/or the claims of the present disclosure may be combined and/or incorporated in various ways, even if such combinations or incorporations are not clearly recited in the present disclosure. In particular, the features recited in the various embodiments and/or the claims of the present disclosure may be combined and/or incorporated in various ways without departing from the spirit and teachings of the present disclosure, and all such combinations and/or incorporations fall within the scope of the present disclosure.

The embodiments of the present disclosure have been described above. However, these embodiments are for illustrative purposes only, and are not intended to limit the scope of the present disclosure. Although the various embodiments are described above separately, this does not mean that the measures in the various embodiments may not be advantageously used in combination. The scope of the present disclosure is defined by appended claims and their equivalents. Without departing from the scope of the present disclosure, those skilled in the art may make various substitutions and modifications, and these substitutions and modifications should all fall within the scope of the present disclosure.

What is claimed is:

1. A method of manufacturing a terahertz detection device, the terahertz detection device comprising detectors and lenses arranged in an array, wherein the method comprises:

forming a plurality of detectors in a first area of a first surface of a base substrate through a double-sided photoetching process so as to form a detector array, and providing at least one first alignment mark in a second area of the first surface of the base substrate;

forming a plurality of lens mounting parts in a third area of a second surface of the base substrate through the double-sided photoetching process, and providing at least one second alignment mark in a fourth area of the second surface of the base substrate; and mounting the lenses to the lens mounting parts to form the terahertz detection device, wherein after the first alignment mark is provided and before the second alignment mark is provided, a position of the second alignment mark is determined by using a double-sided photoetching machine to align the first alignment mark with the second alignment mark, so that an offset of a center of the detector with respect to a center of the lens mounting part is within a preset range of 0 to 10 μm;

wherein the forming a plurality of lens mounting parts in a third area of a second surface of the base substrate through the double-sided photoetching process comprises: coating a photoresist on the second surface of the base substrate, wherein a coating thickness of the photoresist is in a range of 3 to 5 μm; drying, exposing, and developing the photoresist; and etching the base substrate to form the lens mounting parts; and wherein an etching depth of the lens mounting part is greater than or equal to 30 μm.

2. The method according to claim 1, wherein a projection of the detector on the base substrate is located within a projection of the lens mounting part on the base substrate.

3. The method according to claim 1, wherein the detector comprises a sensitive unit and a detection antenna, and the center of the detector coincides with a center of the sensitive unit.

4. The method according to claim 1, wherein the coating a photoresist on the second surface of the base substrate comprises:

precoating the photoresist on the base substrate, wherein a rotating speed of the precoating is 500 to 700 rpm, and a duration of the precoating is 5 to 7 seconds; and after the precoating is completed, performing a second coating, wherein a rotating speed of the second coating is 5000 to 6000 rpm, and a duration of the second coating is 15 to 25 seconds.

5. The method according to claim 1, wherein the drying comprises a first drying and a second drying;

a duration of the first drying is 1.8 to 2.2 minutes, and a temperature of the first drying is within a range of 95 to 105° C.; and a duration of the second drying is 0.8 to 1.2 minutes, and a temperature of the second drying is within a range of 85 to 95° C.

6. The method according to claim 1, wherein a duration of the exposing is 6 to 8 seconds, and a duration of the developing is 30 to 40 seconds.

7. The method according to claim 1, wherein a projection of the lens on the base substrate is circular;

an inner diameter of the lens mounting part is larger than an outer diameter of the lens; and a difference between the inner diameter of the lens mounting part and the outer diameter of the lens is less than or equal to 5 μm.

8. The method according to claim 7, wherein an inner diameter of the lens mounting part on a side of the lens mounting part close to the base substrate is smaller than an inner diameter of the lens mounting part on a side of the lens mounting part away from the base substrate.

9. The method according to claim 1, wherein the base substrate is etched by an inductively coupled plasma etching machine.

10. The method according to claim 1, wherein types of the lenses comprise at least one of a sub-hemispherical lens, a hemispherical lens, and a hyper-hemispherical lens.

11. The method according to claim 1, wherein after mounting the lenses to the lens mounting parts to form the terahertz detection device, and the method further comprises:

coating an adhesive on a joint of the lens and the base substrate to fix the lens on the base substrate; or mounting a fixing piece on the base substrate to fix the lens on the base substrate.

12. A terahertz detection apparatus, comprising detectors and lenses arranged in an array, wherein the terahertz detection apparatus is manufactured by:

forming a plurality of detectors in a first area of a first surface of a base substrate through a double-sided photoetching process so as to form a detector array, and providing at least one first alignment mark in a second area of the first surface of the base substrate;

forming a plurality of lens mounting parts in a third area of a second surface of the base substrate through the double-sided photoetching process, and providing at least one second alignment mark in a fourth area of the second surface of the base substrate; and mounting the lenses to the lens mounting parts, wherein after the first alignment mark is provided and before the second alignment mark is provided, a position of the second alignment mark is determined by using a double-sided photoetching machine to align the first alignment mark with the second alignment mark, so that an offset of a center of the detector with respect to a center of the lens mounting part is within a preset range of 0 to 10 μm;

wherein the forming a plurality of lens mounting parts in a third area of a second surface of the base substrate through the double-sided photoetching process comprises: coating a photoresist on the second surface of the base substrate, wherein a coating thickness of the photoresist is in a range of 3 to 5 μm; drying, exposing, and developing the photoresist; and etching the base substrate to form the lens mounting parts; and wherein an etching depth of the lens mounting part is greater than or equal to 30 μm.

* * * * *